United States Patent [19]

Collins et al.

[11] Patent Number: 4,564,943

[45] Date of Patent: Jan. 14, 1986

[54] SYSTEM PATH STRESSING

[75] Inventors: John C. Collins; John J. DeFazio, both of Poughkeepsie, N.Y.

[73] Assignee: International Business Machines, N.Y.

[21] Appl. No.: 510,802

[22] Filed: Jul. 5, 1983

[51] Int. Cl.[4] .......................................... G01R 31/28
[52] U.S. Cl. .................................. 371/28; 324/73 R; 371/61
[58] Field of Search ...................... 371/28, 25, 61, 62; 324/73 R, 73 AT

[56] References Cited

U.S. PATENT DOCUMENTS

| 3,047,841 | 7/1962 | Kondi | 371/28 X |
|---|---|---|---|
| 3,196,390 | 7/1965 | Smeltzer et al. | 371/28 |
| 3,252,097 | 5/1966 | Homan | 371/28 X |
| 3,633,174 | 1/1972 | Griffin | 364/900 |
| 3,659,087 | 4/1972 | Green et al. | 364/486 |
| 3,737,637 | 6/1973 | Frankeny et al. | 371/28 |
| 3,761,695 | 9/1973 | Eichelberger | 371/25 |
| 3,783,254 | 1/1974 | Eichelberger | 371/25 |
| 3,784,907 | 1/1974 | Eichelberger | 324/73 AT |
| 3,805,152 | 4/1974 | Ebersman et al. | 324/73 R |
| 3,814,920 | 6/1974 | Huelters | 371/25 |
| 3,916,306 | 10/1975 | Patti | 324/73 R |
| 4,025,768 | 5/1977 | Missios et al. | 371/28 |
| 4,058,767 | 11/1977 | Muehldorf et al. | 324/73 R |
| 4,063,078 | 12/1977 | Das Gupta et al. | 364/700 |
| 4,063,080 | 12/1977 | Eichelberger | 371/62 |
| 4,144,448 | 3/1979 | Pisciotta et al. | 371/62 |
| 4,298,980 | 11/1981 | Hajdu et al. | 371/25 |
| 4,362,957 | 12/1982 | Stern | 371/61 |
| 4,476,431 | 10/1984 | Blum | 324/73 R |
| 4,477,902 | 10/1984 | Puri et al. | 371/25 |

OTHER PUBLICATIONS

IBM Technical Disclosure Bulletin, vol. 24, No. 2, Jul. 1981, Programmable Digital Delay Test Circuit, D. W. Maiden et al., pp. 1176–1177.
IBM Technical Disclosure Bulletin, vol. 20, No. 1, Jun. 1977, Accurate Proportional Variable Stress Testing Hardware Logic Design Using Software Simulation, R. N. Ames and J. C. Leininger, pp. 6–8.

Primary Examiner—Charles E. Atkinson
Attorney, Agent, or Firm—Sughrue, Mion, Zinn Macpeak & Seas

[57] ABSTRACT

In a data processing system in which data is sent over a data path between at least first and second devices, a clock distribution network is provided with the capability of selectively delaying the clock signal to either the sending or receiving devices to stress the short and long data paths.

13 Claims, 20 Drawing Figures

FIG. 6

LP  $T - T_{DD} - W_{CTE} - T_{CTL} - T_X$
SP  $W_{CTL} + T_{CTE} + T_Y - T_{DD}$

FIG. 11A  NOMINAL LATCH  ≈ 200 ps
FIG. 11B  FINE  ≈ 500 ps
FIG. 11C  MEDIUM  ≈ 800 ps
FIG. 11D  COARSE

FIG. 10 TRUTH TABLE FOR PATH STRESSING

| A LONG/SHORT | B STRESS | C FINE/COARSE | D GATE STRESS OFF | E COARSE STRESS | F MEDIUM STRESS | G FINE STRESS | H SHORT STRESS | I LONG STRESS | COMMENT * |
|---|---|---|---|---|---|---|---|---|---|
| 0 | 0 | 0 | 1 | X | X | X | 0 | 0 | NORMAL OPERATION |
| 0 | 0 | 1 | 0 | 0 | 1 | 1 | 1 | 0 | COARSE SHORT |
| 0 | 1 | 0 | 0 | 1 | 0 | 1 | 1 | 0 | MEDIUM SHORT |
| 0 | 1 | 1 | 0 | 1 | 1 | 0 | 1 | 0 | FINE SHORT |
| 1 | 0 | 0 | X | X | X | X | X | X | UNUSED STATE |
| 1 | 0 | 1 | 0 | 0 | 1 | 1 | 0 | 1 | COARSE LONG |
| 1 | 1 | 0 | 0 | 1 | 0 | 1 | 0 | 1 | MEDIUM LONG |
| 1 | 1 | 1 | 0 | 1 | 1 | 0 | 0 | 1 | FINE LONG |

*NOTE: FOR SHORT PATH STRESS, THE LATCH CLOCK ARRIVES LATE. FOR LONG PATH STRESS, THE TRIGGER CLOCK ARRIVES LATE.

SYSTEM PATH STRESSING

BACKGROUND OF THE INVENTION

1. Field of the Invention

This invention relates to the testing of logic systems for use in all types of digital computers, including both general purpose and scientific computers. More specifically, the invention relates to a method and apparatus for testing the sensitivity of logic systems to AC timing variations.

2. Description of the Prior Art

The testing of logic subsystems in a computer system is a well-developed art, and is important in achieving highly reliable computer systems. It is also an important diagnostic tool not only for trouble-shooting existing computer systems but for examining and understanding the operation of logic subsystems with a view toward improving the design thereof. It is often desirable to test different aspects of logic system operation. For example, U.S. Pat. No. 3,659,087 issued on Apr. 25, 1972 to Green et al, and assigned to the same assignee as the present application, describes a technique for testing the sensitivity of a device under test (DUT) to pulse width. U.S. Pat. No. 3,633,174 issued on Jan. 4, 1972 to Griffin tests the sensitivity of a core memory to read strobe timing. U.S. Pat. No. 3,814,920 issued on June 4, 1974 to Huelters tests a device for logic faults.

The advent of Level Sensitive Logic Systems (LSSD) in digital computers has provided a minimization of race conditions, hazards and AC timing dependencies. Functional logic units are made solely dependent on the occurrence of the signals from plural clock trains, and this is accomplished by using clocked DC latches for all internal storage circuitry. The plural clock trains are synchronous and independent, and the various sets of latch circuitry are coupled through combinational logic to other sets of latches that are controlled by other system clock trains. For a more complete description of level sensitive logic systems, reference is made to commonly assigned U.S. Pat. Nos. 3,783,254 issued Jan. 1, 1974 to Eichelberger, and 4,063,080 issued Dec. 13, 1977 to Eichelberger et al, and the reference cited therein.

The designers of computer logic have had complete flexibility in arranging the timing relationships between the plural clock trains. For performance advantages, the clock relationships may be highly overlapped, underlapped, or offset by large fractions of the system cycle. Each of these implementations creates special path timing relationships that must be satisfied. System timing programs have been developed to aid the computer designer in meeting system path length criteria, but the independence of the programs to hardware, and the flexibility of the design arrangements, have often led to unexpected system timing problems in bring-up, and significant complexity in educating the field service personnel in diagnostic methods.

The advance of large scale integration (LSI) has further complicated system timing problems. It has become impossible to test each circuit for AC parameters such as rise delay, fall delay, rise time, etc. It has also become impractical to test for AC parameters at the Field Replacement Unit (FRU) level, and the first exposure to verification of system timing integrity occurs at the complete system level. The difficulty of timing verification can be better understood by considering the components involved in a system CPU. A high performance system may average 500 circuits/gates per chip and may contain up to 100 chips per FRU. A central processing unit may contain up to nine separate FRU's, and the total number of gates per CPU can therefore exceed 400,000. The number of critical paths within the CPU will be in the tens of thousands. Even a fraction of a percent of path timing errors could significantly impact hardware development cycles, and degradation of circuit performance in the field could also have a significant adverse impact on customer operation.

With increases in the complexity of logic systems, testing techniques have also become more sophisticated. U.S. Pat. No. 4,298,980 issued Nov. 3, 1981 to Hajdu et al, U.S. Pat. No. 3,916,306 issued Oct. 28, 1975 to Patti, and U.S. Pat. No. 3,761,695 issued Sept. 25, 1973 to Eichelberger, all commonly assigned with the present application, teach various techniques for testing the integrity of logic systems, i.e. testing for logic faults. However, while these testing techniques may detect logic hardware faults, there is a need for a better technique for isolating timing problems.

With increases in performance and operating speeds of computer systems, timing relationships between system functions have become more intricate, and the solving of timing problems has taken a higher priority. U.S. Pat. No. 4,058,757 issued Nov. 15, 1977 to Meuhldorf et al teaches a technique for measuring the switching times for a DUT. U.S. Pat. No. 4,144,448 issued Mar. 13, 1979 to Pisciotta et al discloses a technique for monitoring a plurality of clock signals. Maiden et al, "PROGRAMMABLE DIGITAL DELAY TEST CIRCUIT", IBM Technical Disclosure Bulletin, Vol. 24, No. 2, July 1981, pages 1176–1177, disclose a circuit for testing the sensitivity of channel interfaces to timing delays.

The use of unique timing relationships between plural (or multiple) clocks has allowed the computer designer the advantage of utilizing all timing techniques to obtain the best system path performance. However, the number of timing problems in both system bring-up and in timing failures in the field environment dictate that provision must be made for eliminating the dependencies of the past. New logical organizations must be utilized in computing systems to take advantage of high performance design. Timing dependencies and sensitivities must be controlled within the multiple clock train design.

Of specific interest in complex and high speed logic systems is the propagation delay of signals through the system. U.S. Pat. No. 3,805,152 issued Apr. 16, 1974 to Ebersman et al discloses a testing technique in which the output of a DUT is made to oscillate, with the frequency of oscillation representing the propagation delay. U.S. Pat. No. 3,784,907 issued Jan. 8, 1974 to Eichelberger discloses a propagation delay testing technique wherein a primary system input is changed and, after a predetermined time corresponding to an acceptable propagation delay through the selected path, the output of the path is monitored to see if a corresponding change has occurred.

The above-cited U.S. Pat. No. 4,063,080 to Eichelberger et al discloses a technique for propagation delay testing wherein inputs are provided to a logic system and, at a predetermined time later corresponding to the expected operating speed of the system, the output is monitored to determine if a corresponding change has occurred.

Ames et al, "ACCURATE PROPORTIONAL VARIABLE STRESS TESTING HARDWARE LOGIC DESIGN USING SOFTWARE SIMULATION", IBM Technical Disclosure Bulletin, Vol. 20, No. 1, June 1977, pages 6–8, disclose a technique for the stress testing of hardware logic design. This technique simulates propagation delays in order to assist in the design of logic systems.

It would be desirable in high performance computer systems to time stress the system logic to determine the failure margins, or to trouble-shoot marginal or unstable errors. Such a stressing function would be useful in engineering bring-up, and in field engineering diagnostics and trouble-shooting.

SUMMARY OF THE INVENTION

It is therefore an object of the present invention to provide a method and apparatus for system path stressing which is capable of effectively determining the sensitivity of logic systems to timing variations.

It is a further object of this invention to provide such a method and apparatus for testing system short or long logic paths in a non-destructive manner without performance penalties to system operation.

It is a still further object of this invention to provide such a method and apparatus which will allow a system to run in a degraded mode of operation, if required, upon failure detection.

Briefly, these and other objects of the invention are achieved by the provision of a clock distribution network of simple construction capable of providing clock signals at a number of discrete different timings. By incrementally adjusting the relative timings of the sending and receiving clock signals, the short and long paths can be stressed individually to determine failure margins or to determine if a particular error is due to a system timing problem.

In contrast to prior art logic testing arrangements, the testing arrangement of the present invention is generalized and is applicable to all levels of the logic structure. The generalized logic system eliminates the critical system AC path timing dependencies encountered in bring-up or diagnostics. The long path limit, i.e. the maximum amount of combinational logic delay, can be expanded or contracted to provide a series of discrete, flexible AC timings by the additional logic circuitry.

Adjustment of the synchronous and independent clock train arrival times, regardless of their edge relationships or clock types, will provide adjustment of the path limits. The additional logic circuitry is embedded directly within the multiple clock train distributions and is controlled by the system maintenance processor. In one disclosed embodiment, three levels of discrete settings are provided: medium, coarse and large. The delay settings are implemented utilizing differential circuit delays, and only late clock train settings are utilized in order to ensure no degradation of system performance. A decoding of maintenance processor signals selects the incremental adjustment.

The path stressing arrangement according to the present invention enables the bring-up, testing or diagnosis of a computing system in any environment without constraints of timing problems interrupting functional evaluation. Additionally, computer designers can incrementally adjust AC path limits to determine sensitivities to performance, e.g. incrementally stress system path X until failure occurs at limit Y. Another advantage is the ability to operate a computing system marginally degraded until full repairs can be completed or parts obtained. Once a path error is detected, path limits can be adjusted to allow system operation, in a degraded mode, without functional errors occurring.

BRIEF DESCRIPTION OF THE DRAWINGS

The invention will be more clearly understood with reference to the following description in conjunction with the accompanying drawings, wherein.

DETAILED DESCRIPTION OF THE PREFERRED EMBODIMENT

Prior to describing the implementation of the present invention, the "short path" and "long path" limits will be explained. At the system level, data must move through combinational logic paths from one clocked storage element to another. Two types of system timing requirements are critical, i.e. the short path limit and the long path limit, defined for both logic and array data paths. These limits are the minimum and the maximum delays of the data paths between clocked storage elements.

Figures 1, 2, 3:
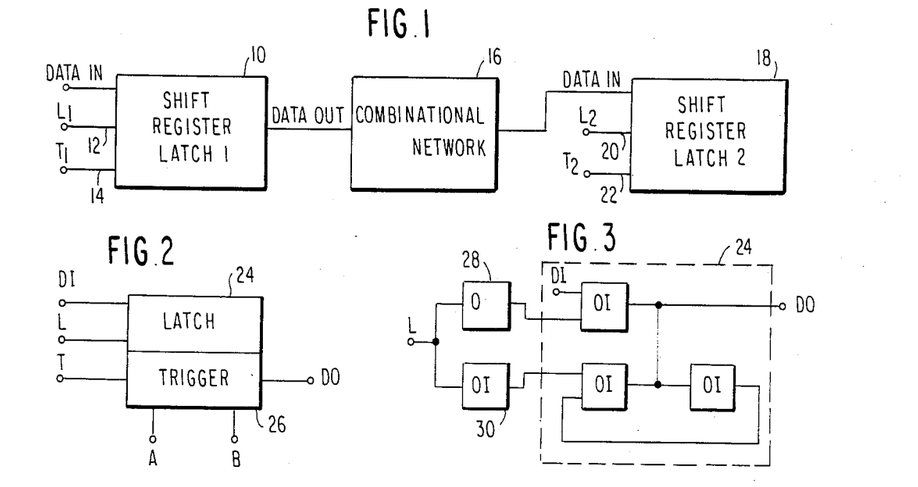
FIG. 1 is a diagram illustrating one example of a common SRL-to-SRL data transfer arrangement.
FIG. 2 is a more detailed illustration of an SRL in FIG. 1.
FIG. 3 is a more detailed diagram of the internal logic of the latch circuitry in FIG. 2.

FIG. 1 illustrates one example of a typical logic path data transfer. At one end of the path is a sending shift register latch (SRL) 10 which is controlled by a latch clock $L_1$ on line 12 and a trigger clock $T_1$ on line 14, to launch or send data into the combinational logic network 16. A receiving SRL 18 captures, or receives, the data from the combinational logic network 16 under the control of a latch clock $L_2$ on line 20 and a trigger clock $T_2$ on line 22.

The SRLs 10 and 18 may be arranged as shown in more detail in FIG. 3. Each SRL may consist of a latch portion 24, receiving input data at a data input terminal DI and latching the input data in response to a latch clock signal received at terminal L, and a trigger portion 26 that responds to a trigger clock at terminal T to launch the data from the data output terminal DO to the combinational logic network 16. The terminals A and B are shift control terminals. FIG. 3 illustrates in more detail the logic gate arrangement of a polarity-hold type latch, including a clock phase splitter comprising an OR gate 28 and an OR-INVERT, or NOR, gate 30. For a more detailed description of SRL design and operation, reference is made to the above-cited U.S. Pat. No. 3,783,254 to Eichelberger, the disclosure of which is incorporated herein by reference.

Figure 4:
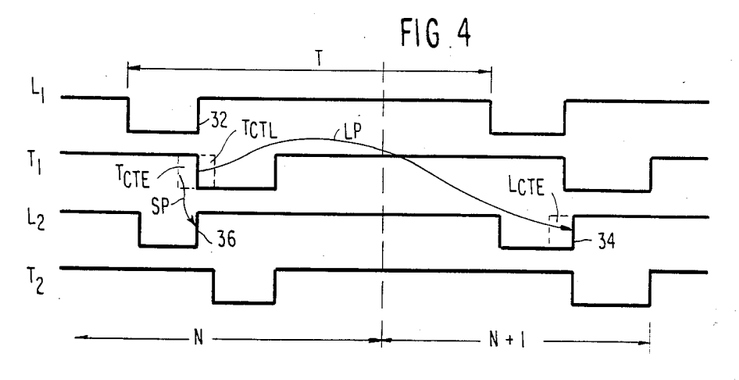
FIG. 4 is a timing diagram illustrating the clock relationships in the SRL-to-SRL system of FIG. 1.

The effect of timing problems on logic data path transfer can be more easily understood with reference to the timing diagrams of FIG. 4. The long path is defined as the transfer of data from one cycle to the following cycle, or transfer from cycle N to cycle N+1, in a period of time less than the machine cycle time. The data is launched by the falling edge 32 of the trigger clock $T_1$ in cycle N, and is subsequently captured by the trailing edge 34 of the receiving latch clock $L_2$ in cycle N+1. The leading edge of the trigger and trailing edge of the latch are nominally aligned with one another.

In an ideal long path, the entire cycle would be filled with machine logic. However, the length of the long path is shortened by inherent uncertainties in clock edge arrival time, and delays through the SRLs themselves. The arrival time uncertainties, or tolerance, are associated with essentially two factors. First, the variations of process, temperature and power supply directly effect circuit performance. Since the clock chips are composed of logic circuits that generate and distribute the clocks, the chips themselves cause the clock edges to have some tolerance. The second factor is wiring variations, including time of flight and characteristic impedance. The clock edges are subject to these variations, since all communications are through wires between chips. The SRL delay directly affects the long path, since it does take a finite amount of time to launch data out of the sending SRL, and to capture that data at the receiving SRL. This delay substracts from the cycle time directly, and thus subtracts from the long path length.

The long path limit can be defined by the following equation:

$$LP \leq T - T_{CTL} - T_{CTE}T_{DD} - (L_{DD} + L_{FD})$$

where T is the machine cycle time, $T_{CTL}$ is the latest tolerance for the sending trigger arrival time, $L_{CTE}$ is the earliest tolerance for the receiving latch arrival time, $T_{DD}$ is the circuit delay through the sending trigger, $L_{DD}$ is the circuit delay in the receiving latch and $L_{FD}$ is the delay through the feedback portion of the receiving latch which guarantees that the data is captured. The terms $L_{DD}$ and $L_{FD}$ added together are generally referred to as the latch set time.

If the long path length is greater than the limit defined in the above equation, data will not be captured in the proper cycle, thereby causing incorrect data to be propagated from this point forward. The long path defines the longest amount of delay which can be permitted through the combinational network 16 while still achieving proper data transfer. Thus, it can be seen that if the latch trailing edge arrives early and/or the trigger leading edge arrives late, the long path limit is shortened. This then reduces the amount of logic that can be performed in the combinational network, and this is the major reason for long path failures.

The other critical timing consideration for proper data transfer is the short path limit. This consideration involves data launched by the sending trigger in cycle N but, due to either a late sending trigger or an early receiving latch, the data is captured by the receiving latch in the same cycle N rather than in the desired cycle N+1. FIG. 4 also shows the timing diagram for a short path. Data is launched by the falling edge 32 of the sending trigger $T_1$ and is again captured by a trailing edge of the receiving latch clock. However, due to the early occurrence of the trigger clock $T_1$, or due to the late occurrence of the receiving latch clock $L_2$, the data is captured at the receiving latch by the trailing edge 36 of the clock $L_2$, which is one cycle earlier than desired.

The minimum amount of short path delay can be conceptually easily understood from the illustration of FIG. 4. The delay through the combinational logic must be sufficiently long such that given the worst case of an early trigger clock and a late latch clock, the data launched by the trigger in the cycle N will not arrive at the receiving latch until after the latch clock signal has already occurred in the same cycle N. The minimum short path may be defined as follows:

$$SP \geq T_{CTE} + L_{CTL} - T_{DD}$$

where $T_{CTE}$ is the earliest tolerance of the sending trigger clock arrival time, $L_{CTL}$ is the latest tolerance for the receiving latch clock arrival time, and $T_{DD}$ is the delay through the sending trigger. If the trigger clock leading edge arrives early, and/or the latched trailing edge arrives late, the minimum short path length is increased. This means that the logic path must be at least this length, or longer, to prevent data from being captured one cycle too soon, and to guarantee that data will be captured in the proper cycle. The delay of the sending trigger aids the short path because it is inherent in the path design, and the amount of delay therefore need not be taken into account in the logic path length design.

Again, the uncertainties of clock edge arrival time affect the long and short path lengths directly. The circuit tolerances are due to temperature, power supply and process variations, and the wire tolerances are due to time of flight and characteristic impedance variations. These tolerances have been minimized in the clock design, but have not been eliminated, and thus directly affect data path lengths.

Figure 5:
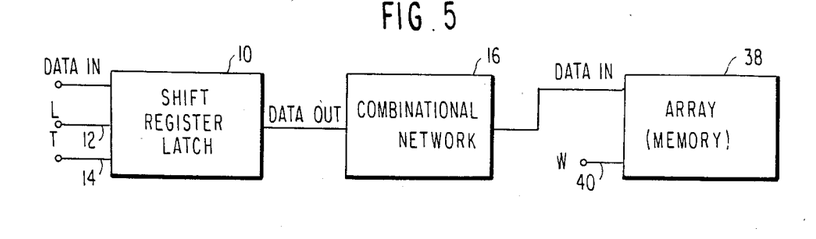
FIG. 5 is an illustration of a conventional array data path.

Long path and short path restrictions also apply to array data paths, as shown in FIG. 5. In this case, the SRL 10 is disposed at one end of the data path and is controlled by latch and trigger clock signals on lines 12 and 14, respectively, as in the case of FIG. 1. At the other end of the data path is a clocked array 38 controlled by an array write clock 40, to write the received data into the proper address location. The array 38 may, for example, be a 4 K RAM chip.

Figure 6:
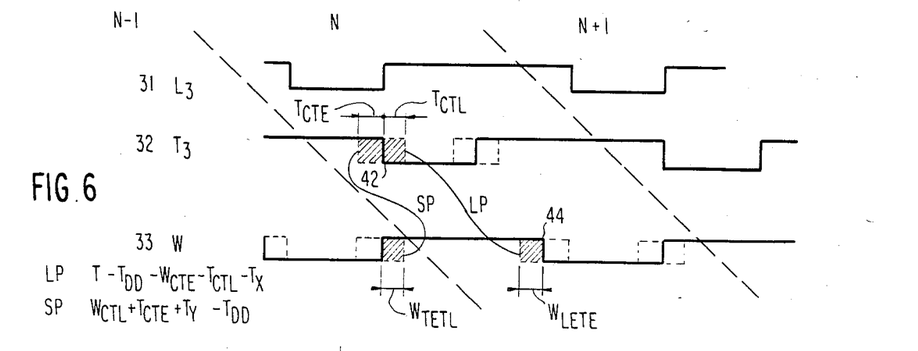
FIG. 6 is a timing diagram illustrating the clock relationships in the SRL-to-array data transfer arrangement of FIG. 5.

The specific timing for the data transfer in the arrangement of FIG. 5 can be more clearly seen with reference to the timing diagram of FIG. 6. Data is launched by the trailing edge 42 of the trigger clock $T_3$ and is subsequently written into the array 38 at the leading edge 44 of the array write clock W. The long path is the data path from the leading edge of the sending trigger $T_3$ in cycle N to the leading edge of the array write clock W, also in the cycle N. The array write clock is normally delayed into the same cycle as the sending trigger clock, and the write clock falling transition allows data to be written into the array.

Figure 7:
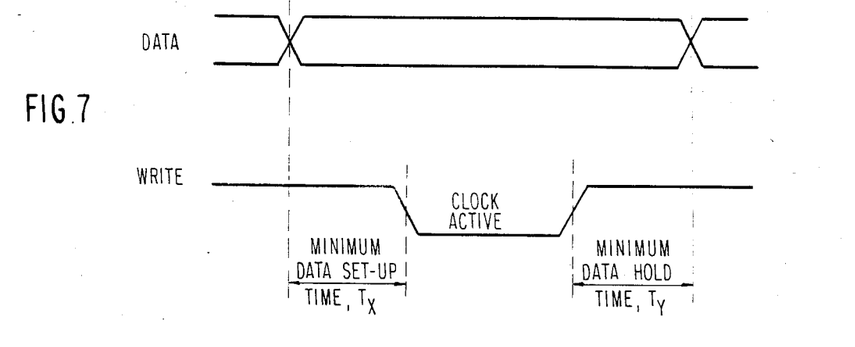
FIG. 7 is a generalized timing diagram illustrating the data and write clock relationships in a typical array.

The long path limit for the data transfer arrangement of FIGS. 5 and 6 may be defined by the following equation:

$$LP \leq T - T_{DD} - W_{CTE} - T_{CTL} - T_X$$

where T is the machine cycle time, $T_{CTL}$ is the latest tolerance for the sending trigger clock arrival time, $W_{CTE}$ is the earliest tolerance for the receiving write clock arrival time, $T_{DD}$ is the delay of the sending trigger, and $T_X$ is the minimum data set-up time of the array itself. The minimum data set-up time $T_X$ can be understood with reference to FIG. 7, i.e., it is a minimum amount of time for which the input data to the array must be allowed to stabilize before the clock signal becomes active. The trigger delay $T_{DD}$ subtracts from the long path because this delay is inherent in the SRL design. The minimum data set-up time $T_X$ also subtracts from the long path because it must accounted for in order for the array to function properly. As indicated by the timing diagram of FIG. 6, if the trigger clock arrives late and/or the array clock arrives early, the long path decreases. The long path delay from the sending SRL to the receiving array must be less than this length to guarantee proper data transfer.

The short path timing limitation for the array involves the launching of data in the cycle N and, because the trigger occurs too early or the array write clock occurs too late, the data is captured by the array write clock of cycle N−1. Thus, in order to ensure that the data is not captured one cycle too early by the array, the propagation delay through the combinational logic 16 must be at least long enough so that, when the worst case of an early trigger clock and a late array write clock occurs, the data will not arrive at the array until after the trailing edge of the array write clock in the cycle N−1. The short path limit may be defined by the following equation:

$$SP \geq W_{CTL} + T_{CTE} + T_Y - T_{DD}$$

where $W_{CTL}$ is the latest tolerance of the write clock arrival time, $T_{CTE}$ is the earliest tolerance of the sending trigger clock arrival time, $T_{DD}$ is the delay time through the trigger, and $T_Y$ is the minimum hold time of the array. The hold time $T_Y$ is illustrated in FIG. 7 as the time required for the array clock to stabilize so that the newly provided data will not be immediately written into the array. The trigger delay $T_{DD}$ subtracts from the short path limit because it is inherent in the path and does not have to be accounted for in the path length. From the timing diagram of FIG. 6 and from the above equations, it can be seen that if the leading edge of the trigger clock arrives early and/or the array write clock arrives late, the short path limit is increased and the combinational path length must reflect this increased short path.

Thus, the criteria for path length limits to propagate valid data are that the data path length must be greater than or equal to the short path length and that the data path length must also be less than or equal to the long path length. If these two criteria are met, data should transfer through the machine properly, barring hardware problems.

The purpose of system path stressing is to isolate system errors that occur due to improper data transfer between clocked storage elements, i.e. timing problems, from hardware problems. This is accomplished by stressing the paths, i.e. by decreasing the long path design window until a long path failure occurs, or by increasing the minimum short path length until a short path failure occurs. This is done in an attempt to determine if errors are due to the timing of the clock distribution network, or whether an actual chip failure has occurred.

The long and short path lengths, as defined in the above equations, have inherent penalties that cannot be eliminated from the machine, such as clock edge arrival time uncertainty and SRL delays. (In this connection, it should be noted that the above equations include delay times of the trigger and latch circuits, and such terms are highly dependent on the type of latch used in the system. Different latch types and different SRL configurations may require the use of different parameters in the long and short path equations.) In any event, although the edge arrival time uncertainty and the SRL delays cannot be removed, and since the minimum set-up and hold times of the array cannot be removed, the one entity in the above equations that can be changed is the nominal arrival time of the clock edges. The path lengths are directly controlled by when the clock edges arrive at the storage elements and, if the edges could be moved in time, either earlier or later, the path limits could be changed. Thus, implementation of path stressing according to the present invention is based on changing the nominal arrival times of the clock edges. The actual implementation, as will be discussed below, may be simplest if the clock edges are made to arrive later in the cycle by adding delay in the clock path, as opposed to subtracting delay from the path.

Before discussing the implementation and operation of the path stressing arrangement of the present invention, two terms should be defined. If a path limit is changed by moving the relative position of the clock edges, the path will either be "stressed" or "relieved". Stressing causes the long path limit to become shorter, thereby decreasing the allowable propagation time through the combinational logic. The short path limit is stressed if the short path limit is made larger, thus increasing the minumum propagation delay time through the combinational logic. Conversely, the long path is relieved if the long path limit is made larger, and the short path is relieved if the short path limit is made smaller. Thus, "relieving" can also be thought of as negative stressing.

From the timing diagrams of FIGS. 4 and 6, it can be seen that the long and short paths can be stressed and relieved independently. For example, in the case of an SRL-to-SRL data transfer, if the latch clock L2 is made to arrive later, the long path from the trigger clock leading edge 32 to the latch clock trailing edge 34 will be increased, thus relieving the long path. However, at the same time, the short path length from the leading edge 32 of the trigger block T1 to the trailing edge 36 of the latch clock L2 will be increased, thereby stressing the short path. On the other hand, if the trigger clock T1 is caused to arrive later, the long path is decreased, or stressed, and the short path in the same cycle is decreased, or relieved. Thus, if a particular path is stressed to test for a timing failure, the other path limit is simultaneously relieved so that it has no timing problems associated with it. This mutually exclusive nature of the logic long and short path stressing capability is highly useful.

The array data paths also exhibit this mutual exclusivity. If the trigger clock $T_3$ is made to arrive later, the long path from the trigger clock to the array write clock W is decreased, or stressed, and at the same time the short path from the trigger clock $T_3$ to the array white clock W will be decreased, or relieved. If the array write clock arrives late, the short path between the sending trigger clock and the receiving write clock is increased, or stressed, while the long path between the sending trigger and the receiving write clock will be simultaneously increased, or relieved.

As can be appreciated from the above discussion, a failure can be brought about by decreasing the long path length or by increasing the short path length. Also, timing problems can be reduced by increasing the long path length or decreasing the short path length. These operations are referred to as "path stressing", which positions the sending and receiving clock edges relative to one another.

One example of a system path stressing configuration according to the present invention will now be described with reference to FIGS. 8-14.

The clock generation and distribution network is an integral part of any high performance machine structure. The clock system is responsible for proper data transfer between clocked storage elements, including SRLs residing on logic chips, and array, or memory, chips. The clock system transfers this data according to precisely defined timing relationships. If these timing criteria are not met, for example as described above, incorrect or improper data will be propagated through the machine. Thus, practically every logic and array chip in the machine will interact with the clock distribution network to some extent.

Figures 8, 11A:
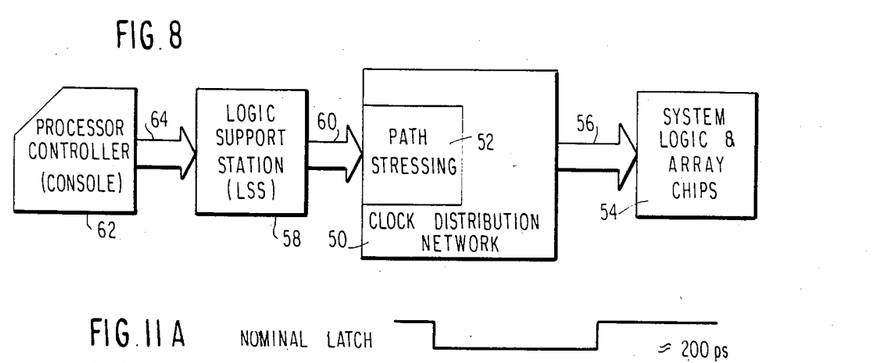
FIG. 8 is an overall diagram of the clock distribution network and associated interfaces of the path stressing system according to the present invention.
FIGS. 11A–D are wave forms illustrating the relative timing of the stressed clock signals in the circuitry of FIG. 9.

At the system level, the clock distribution structure consists of a predetermined set of logic chips that communicate with each other through many wiring connections. These chips are responsible for the generation and distribution of all of the various clock types for the logic and array chips in the machine. The structure also interfaces with the users of the clocks, the logic and array chips in the machine and also with those components that provide the controlling capability to the clock system, e.g. the Processor Controller, or Console, and the Logic Support Station, or LSS. As illustrated in FIG. 8, the clock distribution network 50 includes the clock chips and associated wiring. The path stressing portion 52 is entirely contained within the clock distribution network. The clock distribution network 50 provides the clock signals to the logic and array chips, generally illustrated as a system network 54, through an interface consisting of a plurality of lines 56. It is within the system network 54 that the clocks transfer data between latches on the logic chips, and between logic and array chips. No data are transferred between the clock distribution network 50 and the system network 54, but only clock signals are provided.

The controlling capability of the clock distribution network 50, in general, and the path stressing function 52 in particular, is through the interface with the Logic Support Station (LSS) 58. The LSS controls all of the maintenance-related functions of the machine, including maintenance partitioning, fencing, and SRL initialization. The LSS sends to the path stressing portion 52, via the multiple-line interface 60, a set of control bits that the clock distribution network uses to logically control the path stressing operation. These control bits originate at the Processor Controller, or Console, 62, and are sent to the LSS via a plurality of lines 64 which then sends the control bits to the clock distribution network. The Console 62 is the operator-machine interface that controls the execution of path stressing. A customer engineer or bring-up technician can load in many types of operations at the console, one of which is the path stressing operation. The operator will then have direct control of the path stressing application to be executed. The operator, via the console 62, selects the particular logic subsystem to be stressed, and appropriate clock control sections and subsystem clocks are stopped. The operator then enters into the console the appropriate control bits to be loaded into a stress status register in the LSS 58, and the system clocks are then restarted. The machine will then run for some number of clock cycles with the appropriate stress implemented, and any logic path errors that occur are detected and reported to the console 62 via the LSS in a well known manner.

Figure 9:
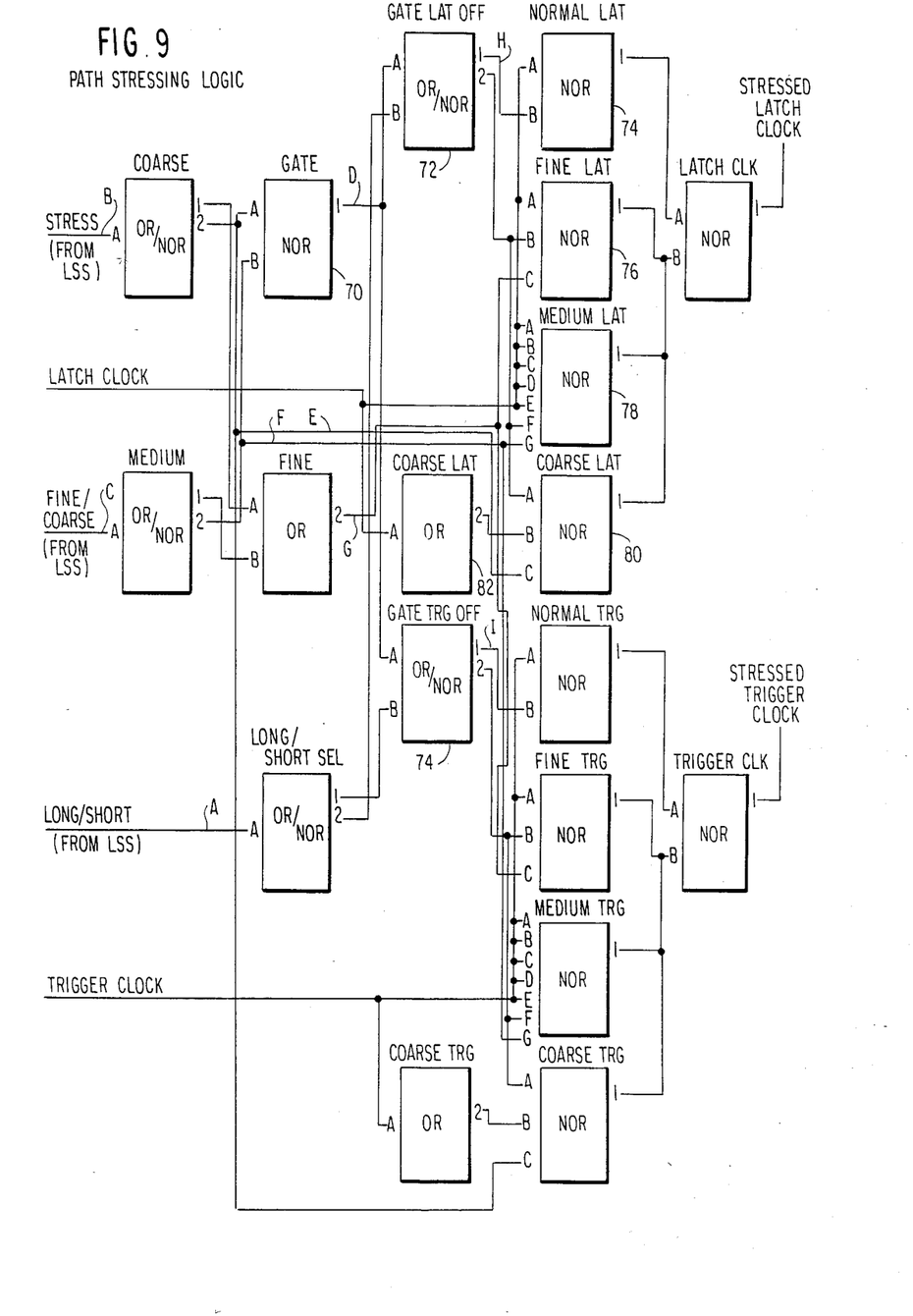
FIG. 9 is a logic diagram illustrating in one example of the system path stressing circuitry of FIG. 8.

FIG. 9 illustrates one example of path stressing circuitry 52 in FIG. 8. The circuitry of FIG. 9 provides only two output clocks, a stressed latched clock and a stressed trigger clock, and would therefore be useful in controlling the system path stressing between the SRLs 10 and 18 in FIG. 2. It should be appreciated, of course, that the stressed latch clock could instead be a stressed array write clock if the circuitry of FIG. 9 were to be used to stress the data paths between the SRL and the memory array of FIG. 5.

Figure 10:
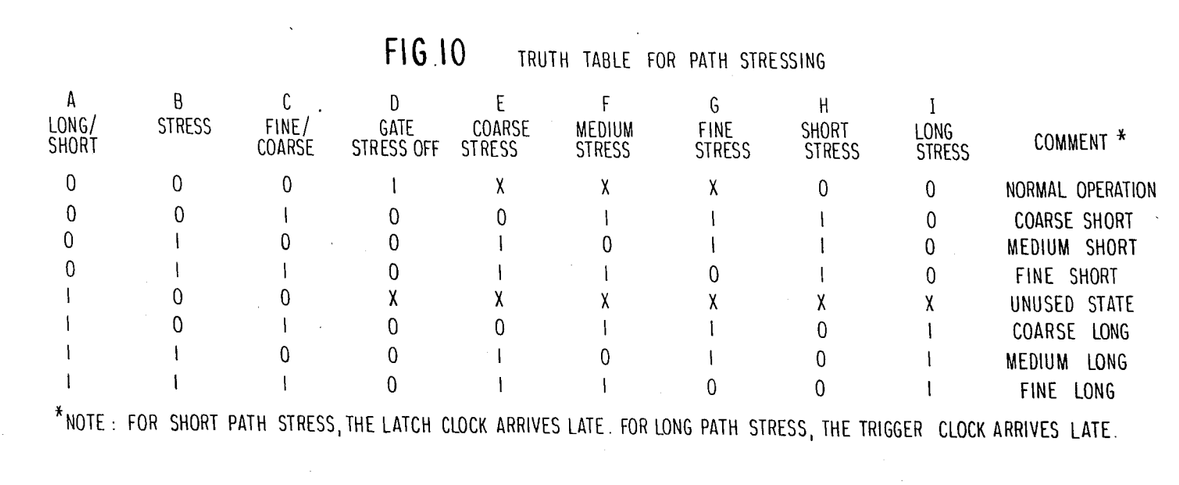
FIG. 10 is a truth table for explaining the operation of the logic circuitry of FIG. 9.

As described above, it is less difficult to add clock delay than to subtract clock delay, and the simplest implementation would therefore be to stress the long path limit by adding delay to the trigger clock and to stress the short path limit by adding delay to the latch clock. The configuration of FIG. 9 is therefore designed to delay only one of either the latch clock or trigger clock depending on which of the system paths is to be stressed. Fine, medium and coarse delays are available for each of the clocks, in addition to a normal mode of operation. The system path stressing control circuitry is accomplished using OR and NOR gates as illustrated, and decodes the three control bits received on lines A, B and C to provide a desired degree of delay to the appropriate clock signal. A truth table explaining the operation of the circuitry of FIG. 9 is illustrated in FIG. 10, and the resulting clock signals are illustrated in FIGS. 11A-11D. For example, if all three control bits A, B and C are zero, the signal D at the output of NOR gate 70 will have a one value and the outputs H and I from NOR gates 72 and 74, respectively, will both have zero values. As a consequence, both of the latch and trigger clocks will be provided in their normal manners.

With the control bit on line A at a zero value, only the short path can be stressed, i.e. only the latch clock can be delayed. There are four possible states, depending on the values of the control bits on lines B and C, with the "all zero" state resulting in normal operation and the other three states resulting in fine, medium and coarse delaying of the latch clock.

Figures 11B, 11C, 11D:
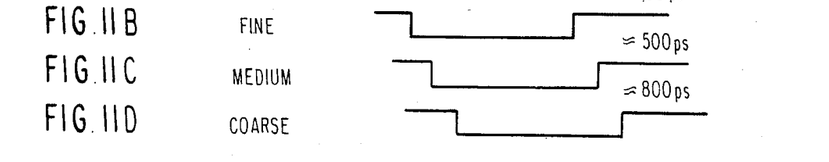

If the short path is to be stressed, either of the control bits on lines B or C can be raised to a one value, thereby causing a zero value output on line D from the NOR gate 70 which, in turn, causes a one value output on line H from the NOR gate 72, thereby disabling the normal latch clock signal. If a fine stressing is desired, both of the control bits on lines B and C are raised to a one level. This raises the signals on lines E and F to a one level to thereby also disable the medium and coarse latch clock signals. As a result, only the output of the fine latch signal NOR gate 76 is enabled. The internal logic of the NOR gate 76 provides a delay of approximately 200 picoseconds (ps), so that the latch clock signal, as shown in FIG. 11B, will be slightly delayed with respect to the nominal latch signal showed in FIG. 11A.

If a medium stressing of the short path is desired, only the control byte on line B is raised to a 1 level. As a result, the signals on lines E and G will both be at a 1 level to thereby disable the fine and coarse latch clock signals. The signal on line F will be at a 0 level to enable the medium latch clock signal NOR gate 78, with the internal logic of the NOR gate 78 being designed to provide a delay of approximately 500 ps as illustrated in FIG. 11C.

Finally, if the coarse stressing of the short path is desired, only the control byte on line C is raised to a 1 level. This will result in 1 level outputs on each of lines F and G to disable the medium and fine latch clock signals, respectively. As a result, only the NOR gate 80 will be enabled. In order to provide the desired delay, e.g., 800 ps, the latch clock signal will first be provided through an OR gate 82, with the combined delays of the gates 80 and 82 resulting in an 800 ps delay in the latch clock signal as is illustrated in FIG. 11D. The delays provided by each of the gates need not be the particular values described above, but could be varied as desired by adjusting the loading of each gate.

If it is desired to stress the long path, i.e., by delaying the trigger clock signal, the control byte on line A is raised to a 1 value, thereby raising the signal on line H to a 1 level and insuring provision of the nominal latch clock signal. To select a fine to medium or coarse stressing of the long path, one or both of the controlled bytes on line B and C are raised to a 1 level and the operation of the trigger clock stressing logic then operates in a manner substantially the same as described above with respect to the latch clock stressing logic.

Figure 12:
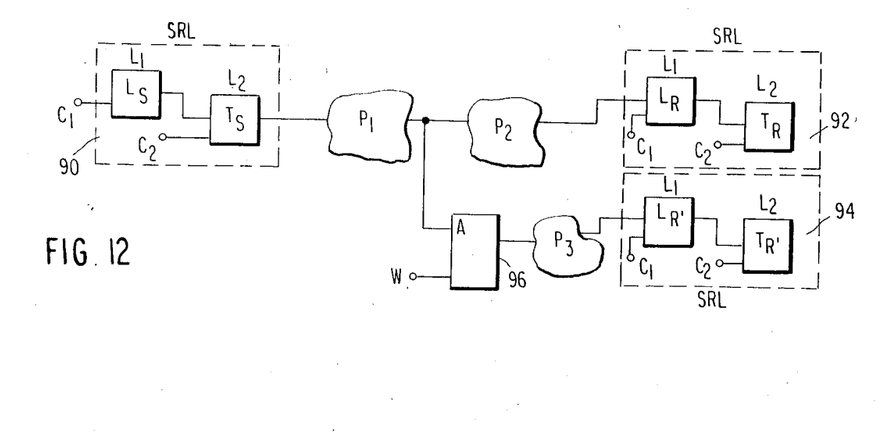
FIG. 12 is a block diagram of a further conventional system network.

While the stress control circuitry described with reference to FIGS. 9-11 will be satisfactory in selectively delaying either the latch or trigger clock signals in a SRL-to-SRL system of FIG. 2, or may selectively delay either the trigger or array write signals in the data transfer arrangement of FIG. 5, it is sometimes necessary to provide three different system clocks, for example to test a logic configuration such as shown in FIG. 12 which includes a sending SRL 90, receiving SRLs 92 and 94, a memory array 96 and combinational logic paths $P_1$, $P_2$, and $P_3$. Long path stressing could be accomplished by delaying the trigger signal or by providing an early latch clock signal or an early array write signal. Short path stressing could be accomplished by providing an early trigger signal or by delaying the latch clock signal or the array write signal.

Figure 13:
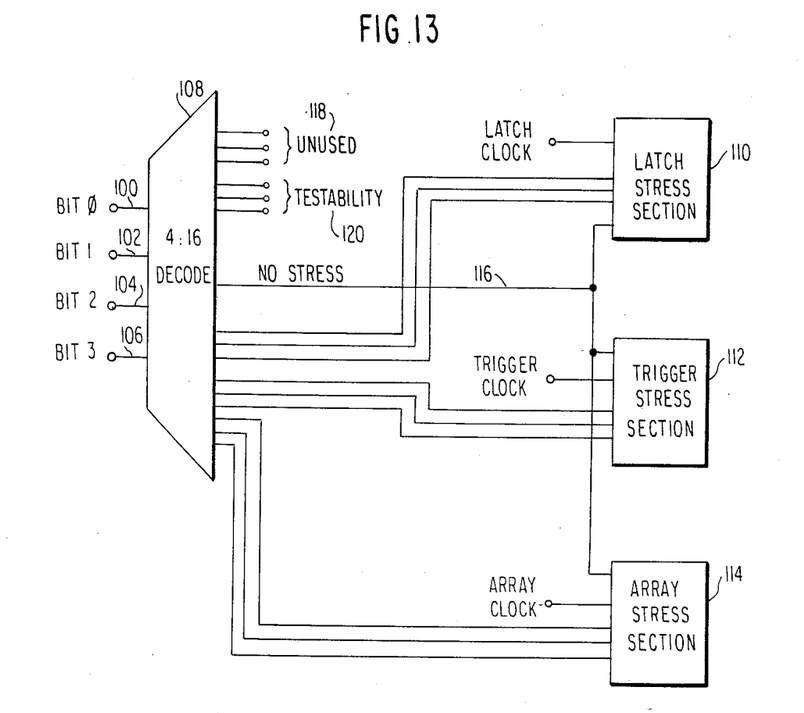
FIG. 13 is a further example of the system path stressing circuitry of FIG. 8.
Figure 14:
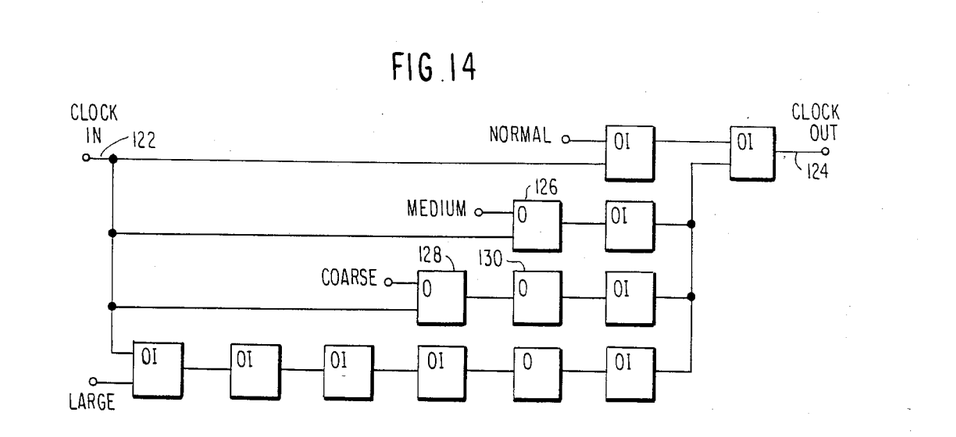
FIG. 14 is a logic diagram illustrating one example of the stressing sections 110, 112, and 114 and FIG. 13.
Figures 15, 16:
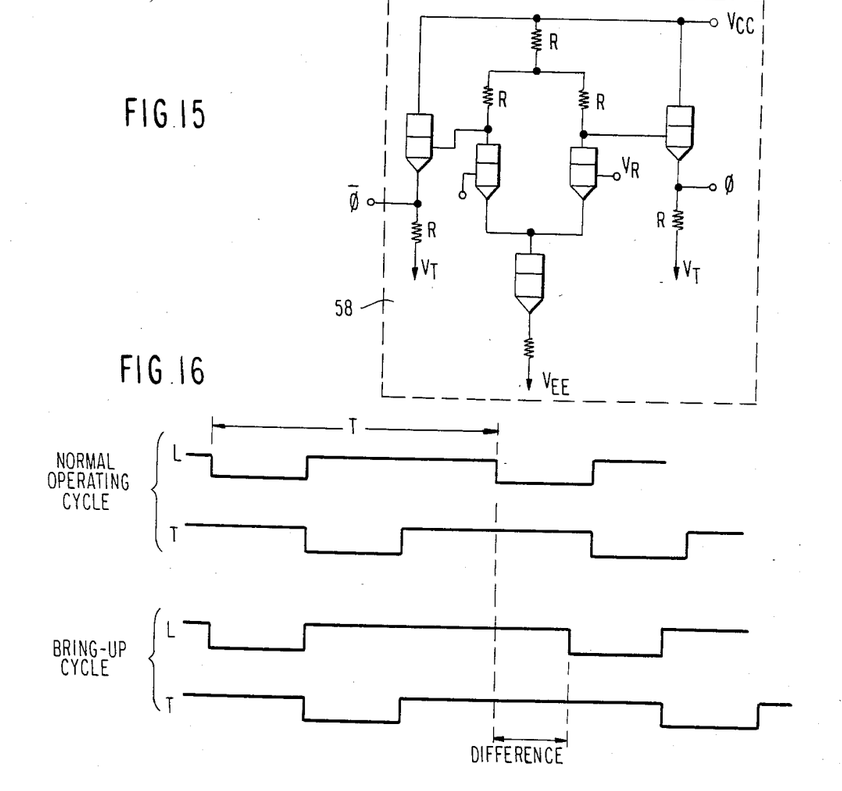
FIG. 15 is a schematic circuit diagram of one example of a NOR gate which may be used in the circuitry of FIG. 14.
FIG. 16 is a timing diagram showing the relationship between latch and trigger clock signals for a logic data path during normal system operation and bring-up operation.

For testing such a configuration, the stress control circuitry 52 in FIG. 8 could be arranged as shown in FIG. 13. The LSS would send four control bytes over lines 100, 102, 104 and 106 to a decoder 108 in the stress control circuit 352. The decoder 108 would be a 4:16 decoder for decoding the four bytes into 16 states. As in the example described above, four levels of stressing would be available, nominal clock operations and three different degrees of delay for any one of the appropriate clock signals. Ten states of the decoder are used to control the amount of stressing applied, with three states controlling the latch clock stressing section 110, three states controlling the trigger clock stressing section 112 and three states controlling the array write clock stressing section 114. The tenth state, represented by the decoder output signal on line 116, would be provided to all three stressing sections 110, 112, and 114 and would indicate that no stressing is to be employed. Three additional states 118 would be unused, and the final three states indicated by reference numeral 120 would be used for testability coverage, as will be explained in more detail below. The individual stressing sections 110, 112, and 114 could be constructed as shown in more detail in FIG. 14, with each section receiving its appropriate clock signal input on line 122 and providing the nominal or stressed clock signal output, as desired, at line 124. In FIG. 14, the different degrees of stressing are designated medium, coarse and large, with the different stressing levels being achieved by serially chaining together a plurality of logic gates to provide a specified amount of delay. The internal configurations of the OR and NOR gates are well known and each of the NOR gates may be constructed as shown for example, in FIG. 15. The operation of the circuitry of FIG. 15 is well known and will in any event, be apparent from the illustration, and in detailed description thereof will be omitted herein.

The normal, or no-stressing applied, clock signal path 59 has two levels of logic in it. The medium path 60 has three logic gates, with the latch gate being common to both paths. Thus, the medium setting will provide a clock signal which is delayed with respect to the normal signal by an amount corresponding to the delay provided by the NOR gate 126. Similarly, the coarse setting will provide an additional delay due to the OR gates 128 and 130, and the large stressing setting will add the delay of 5 logic gates. Thus, if each logic gate provides a delay of one unit, the medium setting will delay the clock edge by one unit of time, the coarse setting will delay the clock edge by two units of time, and the large setting will delay the edge arrival by five units of time. Each unit of delay may, for example, be approximately 0.5 ns.

The values of these settings will obviously depend on the circuit technology family used, and appropriate delay predictions will therefore differ on a case-by-case basis.

There are many applications for system path stressing. Timing errors can be incrementally debugged, timing relationships between elements verified, timing margins tested, system deterioration detected and intermittent errors caught. The system path stressing technique can be applied during engineering bring-up, manufacturing bring-up, or in the field. In the field, stressing data paths can cause an intermittent failure to become a solid failure by changing the relationships of the launching and capturing clocks. This will then isolate the timing problem to a short or long path, whichever causes the failure. The path stressing can also detect system deterioration in terms of temperature or power supply drift. This drift affects the arrival times of the clocks, and path stressing can then be used to position the clocks to determine the relative closeness to the failure point. Finally, the machine could be run in a partially degraded mode. For instance, if a glitch is causing erroneous data to be transferred through the system, the path stressing arrangement according to the present invention could be adjusted to relieve the data transfer error, albeit at an increased cycle time and consequent reduced operating speed. Running at a reduced operating speed, however, is preferable to having the system fail entirely.

During bring-up operation, all testing diagnoses assume a Level Sensitive Scan Design (LSSD) type machine. One LSSD requirement calls for the latches to be controlled by two non-overlapping clocks. If overlap occurs by design or edge arrival uncertainty, the stressing can "un-overlap" the clocks so that the test cases can run. Thus, a non-LSSD machine could be made to operate as an LSSD compatible machine. For a more detailed understanding of LSSD, reference is made again to the above-cited U.S. Pat. No. 3,783,254 to Eichelberger.

The bring-up application of path stresssing is somewhat involved, since, when the power is turned on, timing problems should be eliminated or at least minimized so that functional testing can begin. The main emphasis of the bring-up operation is to make sure the hardware is working from a functional standpoint. After this has been accomplished, the hardware can be run at normal operating speed. There are two distinct bring-up operations to test for functionality: one for logic data paths and the other for array data paths. Each one deals with isolating the timing errors from other hardware errors, such as an array byte or logic byte failure.

The bring-up procedure could be accomplished by first testing the logic data path and then the array data paths, or the reverse. For the purposes of the following discussion, the logic path errors will be treated first.

The first procedure would be to increase the machine cycle from its normal operating speed to a bring-up speed. This is illustrated in FIG. 16, wherein it can be seen that the bring-up cycle is somewhat longer than the normal operating cycle, i.e., the operating speed is slower. The latch clock L and trigger lock T are operating at the normal machine cycle, and the latch clock L, and trigger clock T' are operating at the increased bring-up cycle. The latch clock L' and trigger clock T' would essentially increase the long path limit, since the sending trigger clock remains in the same relative position as the normal operating cycle, but the receiving latch is delayed in time during bring-up. This rids the system of any logic long path data problems. With the long path problems eliminated, the path stressing can be set up to relieve all short path errors by delaying the sending trigger. These two operations should eliminate any problems in the system due to timing. Obviously the bring-up cycle must be large enough such that all long path problems are eliminated, while also leaving room to relieve the short path problems. Thus, with all timing errors non-existent, any errors that occur must be in the logic.

Once all logic errors have been eliminated, the next test for logic data paths again assume that there is an inccreased cycle, which relieves these long paths. The short path problems can now be addressed by delaying the capturing latch clock to stress the short path. Any errors that do exist will be attributable to increasing the short path length.

The third test is to eliminate any long path errors, which includes two subset cases. The first case will assume that all short path errors have been eliminated. The long paths can now be stressed by running the machine at its normal operating cycle and stressing the long path by delaying the sending trigger clock. Any errors that exist should be attributable to the long path decrease.

The second case assumes that short path errors still exist, e.g., in a situation where the short path limit could not be sufficiently relieved to eliminate these errors. However, the long path can still be stressed. The machine can be adjusted to run at the bring-up cycle of FIG. 16, thereby relieving the long path. The short path can then be relieved by negative stress. The machine could then decrease its cycle in an iterative manner to test whether a long path limit exists.

Figure 17:
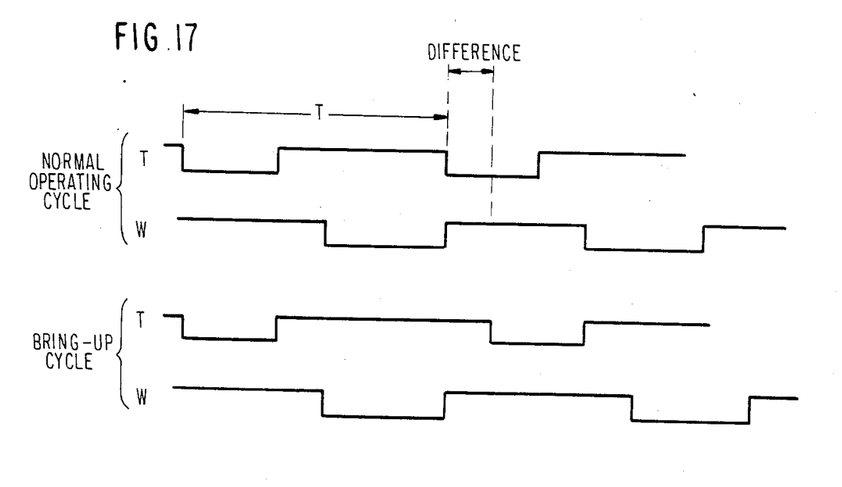
FIG. 17 is a timing diagram showing the relationship between array and trigger clock signals for an array data path during normal system operation and bring-up.

The test procedure to analyze array data paths is very similar to that described above. The first step is to test for a properly functioning array. The machine cycle time is increased from the normal cycle to the bring-up cycle as shown in FIG. 17. In FIG. 17, the trigger clock T and array write clock W are operating at the normal machine cycle, while the trigger clock T' and array write clock W' are operating at the increased bring-up cycle. Operating the machine at the bring-up cycle relieves the short path between the sending trigger and the receiving array write clock, since the array write clock in cycle N−1 remains the same while the trigger clock in cycle N is delayed. The long path between the sending trigger and the receiving array write clock can then be relieved by delaying the array write clock. These two steps eliminate all problems due to timing and the bring-up cycle must be large enough to handle both conditions. Data can now be written into the array and subsequently read out. If an error exists, it is attributable to the array itself.

The second step would be to test and eliminate any long path problems. Again, the machine is brought-up at the increased cycle time to relieve the short path. The long path can now be stressed by delaying the sending trigger clock, thereby decreasing the long path design length. Data can then be written into the array and read out, and errors that exist can be attributed to the decrease in the long path limit, since the array has already been determined to be functioning properly and short path problems do not exist.

The final test for array data paths is to test and eliminate short path errors of which two cases exist. The first case assumes that all long path errors have been eliminated. The machine is broughtup at its normal operating cycle time, and the short path limit can be stressed by delaying the receiving array write clock. Data can then be written into the array and read out and any errors that exist can be attributed to the increase in the short path length.

The second case assumes that long path length errors still exist, since the hardware may not allow the long paths to be sufficiently relieved. The cycle time can be increased to its bring-up cycle to eliminate the short path, and long path problems can be relieved by negative stress. Data can be written into the array and long path problems can then be relieved by negative stress. Data can be written into the array and read out, and if there are no errors, the cycle time can be decreased and data again written into and read out of the array. This procedure can be repeated until an error signifies that a short path length has caused a problem.

The above discussion has focused on how timing errors can be isolated from hardware errors through the use of system path stressing. The actual procedure may require multiple iterations, so that different levels of stressing can be applied to the data path, and the point of failure can be identified. These procedures and iterations are all controlled by thd console 62. Once the isolation has been accomplished, appropriate methods can be employed to eliminate the errors.

Some design constraints should be noted. The first concerns the definition of the stress settings, i.e., the setting granularity since the path stressing utilizes a logic gate implementation, individual circuit tolerances due to temperature, power supply and process must be accounted for. When designing the stress settings, care must be taken to guard against the fastest coarse setting actually being faster than the slowest medium setting. If this happens, all setting resolution and error isolation is lost. On-chip tracking of temperature, power supply and process parameters aid in this design decision, but overlapping of the stress settings must be still be prevented.

A further design constraint concerns the question of DC stuck-fault coverage, or testability. Current test programs and fault simulators cannot distinguish the differences in delay of the four paths in FIG. 14. All that appears are a single input clock on line 122 and a single output clock on line 124, with three redundant paths. Therefore, three states from the decoder 108 have been designed so that the test generator can simulate stuck-faults through those redundant paths using those specifically dedicated states.

The last consideration for the path stressing function is the boundaries on which it can be applied. One obvious boundary is the domain of the clocking network. This is defined as a subsystem, and within this subsystem the latch, trigger, and array clocks can be controlled independently by the LSS to set up the desired stressing function. Another higher level of application would be to apply the stressing to test data paths between subsystems, since each subsystem has its own clock distribution network. The relative timing relationship from one subsystem to another can then be tested. This entire function would come under the control of the console 62, which would include all of the required software to control each subsystem and to determine the sequence of events which must take place when the path stressing is applied.

As can be easily appreciated from the above description, a large number of possibilities exist for timing discrepancies to occur at the system level. However, system path stressing can test for or eliminate these errors in engineering bring-up or in field diagnostics. Future verification testing and error diagnostics can be significantly enhanced by the system according to the present invention.

Further, it can be seen that path stressing according to the present invention also adds to the overall Reliability, Availability, and Serviceability (RAS) of the machine. The RAS strategy is involved in detecting and isolating errors, recovering from those errors and providing a means to keep the machine running through on-line diagnostic programs. Path stressing according to the present invention aids the reliability portion of the RAS, since it can determine the design margin to failure of a particular data path, and can position the clock away from that margin. The availability of that aspect is also enhanced because the path stressing can relieve a problem, albeit at a slower cycle time until a field engineer can replace the failing part. Serviceability is also enhanced, since the path stressing is controlled directly through the console, and the field engineer does not have to go inside the machine to run any diagnostic programs. Thus, the use of path stressing indicates that a significant advantage is gained in RAS at a small price to the hardware of the machine.

We claim:

1. In a data processing system having at least a first device providing output data to a data path in response to a first clock signal, and a second device storing input data from said dath path in response to a second clock signal, a system clock control apparatus for providing said first and second clock signals to said first and second devices, said system clock control apparatus comprising path stressing means for varying the timing relationships between said first and second clock signals, said path stressing means comprising delay means for selectively delaying either one of said first and second clock signals with respect to the other.

2. A system clock control apparatus as defined in claim 1, wherein said path stressing means comprises control means for generating a control signal representing which of said first and second signals is said one signal and the amount of a desired delay, said delay means receiving said control signal and delaying said one signal by said desired delay amount.

3. A system clock control apparatus as defined in claim 2, wherein said first and second devices each comprise a shift register latch.

4. A system clock control apparatus as defined in claim 2, wherein said first device comprises a shift register latch and said second device comprises a memory array.

5. A system clock control apparatus as defined in claim 2, wherein said delay means comprises: a decoder for receiving said control signal and decoding said control signal into a decoder output, and first and second clock signal stressing means coupled to said decoder output and delaying their respective clock signals by amounts in accordance with said decoder output.

6. A system clock control apparatus as defined in claim 2, wherein said delay means comprises a first plurality of clock signal paths having inputs commonly connected to said first clock signal, and providing a first common output, each of said first plurality of clock signal paths delaying said first clock signal by a different amount, a second plurality of clock signal paths having inputs commonly receiving said second clock signal and providing a second common output, each of said second plurality of clock signal paths delaying said second clock signal by a different amount, and means for selectively enabling one of said first and second pluralities of clock signal paths in accordance with said decoder output.

7. In a data processing system of the type having at least a first device providing a data output to a data path in response to a first clock signal and a second device for storing input data from said data path in response to a second clock signal, a method of stressing said data path, said method comprising the steps of:

decreasing the time interval between said first clock signal and said second clock signal, to thereby decrease the long path limit of said data path, whereby the long path limit is the maximum allowable propagation time over said data path between said first and second devices; and increasing the time interval between said first and second clock signals, to thereby increase the short path limit of said data path, where the short path limit is the minimum allowable propagation time over said data path between said first and second devices.

8. A method as defined in claim 7, wherein said decreasing step comprises delaying said first clock signal.

9. A method as defined in claim 8, further comprising the step of monitoring errors in the data stored in said second device to determine the minimum acceptable time interval between said first and second clock signals.

10. A method as defined in claim 7, wherein said increasing step comprises the step of delaying said second clock signal.

11. A method as defined in claim 10, further comprising the step of monitoring errors in the data stored in said second device to determine the maximum acceptable time interval between said first and second clock signals.

12. A method of testing a data processing system, said system being of the type having at least a first device providing a data output to a data path in response to a first clock signal and a second device for storing input data from said data path in response to a second clock signal, and means for providing said first and second clock signals to operate said system with a normal operating cycle, said method comprising the steps of:
  providing first and second clock signals with a cycle time longer than said normal operating cycle;
  stressing said data path in a first direction by delaying one of said first and second clock signals with respect to the other of said first and second clock signals;
  stressing said data path in a second direction by delaying the other of said first and second clock signals with respect to said one of said first and second clock signals; and
  thereafter providing said first and second clock signals to operate said system with said normal operating cycle.

13. A method of testing as defined in claim 12, wherein said one of said first and second clock signals is said first clock signal.

* * * * *